US007838873B2

(12) United States Patent
Clevenger et al.

(10) Patent No.: US 7,838,873 B2
(45) Date of Patent: Nov. 23, 2010

(54) STRUCTURE FOR STOCHASTIC INTEGRATED CIRCUIT PERSONALIZATION

(75) Inventors: Lawrence A. Clevenger, LaGrangeville, NY (US); Matthew E. Colburn, Hopewell Junction, NY (US); Timothy J. Dalton, Ridgefield, CT (US); Michael C. Gaidis, Wappingers Falls, NY (US); Louis L. C. Hsu, Fishkill, NY (US); Carl Radens, LaGrangeville, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 12/193,288

(22) Filed: Aug. 18, 2008

(65) Prior Publication Data

US 2008/0308801 A1    Dec. 18, 2008

Related U.S. Application Data

(62) Division of application No. 11/619,196, filed on Jan. 3, 2007, now Pat. No. 7,544,578.

(51) Int. Cl.
*H01L 47/00* (2006.01)
*H01L 23/58* (2006.01)

(52) U.S. Cl. ............. 257/40; 257/5; 257/E47.001; 257/E51.003

(58) Field of Classification Search ............. 257/5, 257/40, 48, E47.001, E51.003
See application file for complete search history.

(56) References Cited

U.S. PATENT DOCUMENTS

| 4,510,673 A | 4/1985 | Shils et al. |
| 4,896,034 A | 1/1990 | Kiriseko |
| 5,079,725 A | 1/1992 | Geer et al. |
| 5,350,715 A | 9/1994 | Lee |

(Continued)

FOREIGN PATENT DOCUMENTS

EP          0311087 B1      10/1993

(Continued)

OTHER PUBLICATIONS

Antonio Daud Jr. et al.; "Microphase Separation of Diblock Copolymer with Moving Walls;" Brazilian Journal of Physics, vol. 34, No. 2A, Jun. 2004; pp. 405-407.

(Continued)

*Primary Examiner*—David S Blum
(74) *Attorney, Agent, or Firm*—Cantor Colburn LLP; Louis Percello

(57) ABSTRACT

A method of forming a stochastically based integrated circuit encryption structure includes forming a lower conductive layer over a substrate, forming a short prevention layer over the lower conductive layer, forming an intermediate layer over the short prevention layer, wherein the intermediate layer is characterized by randomly structured nanopore features. An upper conductive layer is formed over the random nanopore structured intermediate layer. The upper conductive layer is patterned into an array of individual cells, wherein a measurable electrical parameter of the individual cells has a random distribution from cell to cell with respect to a reference value of the electrical parameter.

9 Claims, 4 Drawing Sheets

U.S. PATENT DOCUMENTS

| | | |
|---|---|---|
| 5,847,650 A | 12/1998 | Zhou et al. |
| 5,881,155 A | 3/1999 | Rigal |
| 6,707,539 B2 | 3/2004 | Selinfreund et al. |
| 2002/0017708 A1 | 2/2002 | Takagi et al. |
| 2003/0005274 A1 | 1/2003 | Bresemann et al. |
| 2004/0265548 A1 | 12/2004 | Ho et al. |
| 2005/0040397 A1 | 2/2005 | Hui et al. |
| 2005/0042780 A1 | 2/2005 | Matsunami |
| 2005/0225375 A1 | 10/2005 | Anderson, II et al. |
| 2005/0250053 A1 | 11/2005 | Marsh et al. |
| 2005/0253137 A1 | 11/2005 | Whang et al. |
| 2006/0134556 A1 | 6/2006 | Nealey et al. |
| 2008/0038923 A1 | 2/2008 | Edelstein et al. |

FOREIGN PATENT DOCUMENTS

| | | |
|---|---|---|
| JP | 60109225 A | 6/1985 |
| JP | 63107014 A | 12/1988 |
| JP | 08162510 A | 6/1996 |

OTHER PUBLICATIONS

Japanese Abstract for JP 04334010 A, published Nov. 20, 1992.

US 7,838,873 B2

STRUCTURE FOR STOCHASTIC INTEGRATED CIRCUIT PERSONALIZATION

CROSS-REFERENCE TO RELATED APPLICATION

This application is a divisional of U.S. patent application Ser. No. 11/619,196, filed Jan. 3, 2007, the disclosure of which is incorporated by reference herein in its entirety.

BACKGROUND

The present invention relates generally to semiconductor device processing techniques and, more particularly, to a structure and method for stochastic integrated circuit personalization.

Authentication is a very effective means to prevent faking or counterfeiting in the world or commercial transactions. Different means of authentication have been implemented in various industries such as, for example: the use of laser holograms in credit cards, unique water marks or embedded metal threads in monetary bills, and certain types of embedded smart chips in passports or driver's licenses. An underlying mechanism of each of these schemes is the incorporation of unique identification keys for each device or product, the keys being unique in that they are very difficult to reproduce from a statistical standpoint. In principle, the longer the identification key, the more difficult it becomes to crack the key.

In the case of a semiconductor device, physical features are typically formed through the use of photolithographic patterning and etching of layers, using one or more designed masks with the desired features to be defined in the device layers. However, in order to form a physically unique structure from chip to chip, a specifically designed mask is ordinarily required. In terms of providing a sufficiently secure identification key using unique patterns on a device, the sheer number of individual masks needed to provide a significant number of customized features becomes too impractical a task.

Accordingly, it would be desirable to be able to form a customized integrated circuit device having randomly distributed features or characteristics such that it is possible to create a secure identification key for an individual chip, and in a manner that is practical and relatively easy to incorporate within existing semiconductor fabrication capabilities.

SUMMARY

The foregoing discussed drawbacks and deficiencies of the prior art are overcome or alleviated by a stochastically based integrated circuit encryption structure, including a substrate having an array of individual cells formed thereupon, each of the array cells including at least one layer therein formed in a manner so as to result in a nanopore structure of varying shape and size distribution among the cells, wherein a measurable electrical parameter of the individual cells has a random distribution from cell to cell with respect to a reference value of the electrical parameter.

In another embodiment, a method of forming a stochastically based integrated circuit encryption structure includes forming a lower conductive layer over a substrate, forming a short prevention layer over the lower conductive layer, forming an intermediate layer over the short prevention layer, wherein the intermediate layer is characterized by randomly structured nanopore features. An upper conductive layer is formed over the random nanopore structured intermediate layer. The upper conductive layer is patterned into an array of individual cells, wherein a measurable electrical parameter of the individual cells has a random distribution from cell to cell with respect to a reference value of the electrical parameter.

TECHNICAL EFFECTS

As a result of the summarized invention, a solution is technically achieved in which an a diblock copolymer material is used to pattern and form an integrated circuit array of randomly distributed electrical characteristics, such as capacitance or resistance. The randomly patterned array structure can in turn be used to form a unique cryptographic key for the chip on which the array is fabricated.

BRIEF DESCRIPTION OF THE DRAWINGS

Referring to the exemplary drawings wherein like elements are numbered alike in the several Figures.

DETAILED DESCRIPTION

Disclosed herein is a structure and method for stochastically based integrated circuit personalization. Briefly stated, a diblock copolymer material is used to form a mask having an array of randomly distributed nanopore structures. The unique random pattern of the diblock copolymer mask is then transferred into a semiconductor device layer (e.g., a capacitor dielectric layer or resistive material layer) such that individual cells defined within an array of the layer have measurable attributes (e.g., capacitance, resistance) that vary from cell to cell. In turn, the formed array with randomly distributed values from cell to call may be read by support circuitry formed on the device in a manner that generates a unique cryptographic key for the chip. In this manner, a unique key can be formed on each chip without a specifically designed lithographic masking level. In an exemplary application, read and decode functions can be implemented through on-chip decode circuits coupled to the array structure.

In particular, a semiconductor device layer (e.g., capacitor dielectric material) is patterned using thin film materials with a "self-assembling" or stochastic attribute to create unique arrays on each chip, and combined with on-chip logic circuitry for readout of the key during wafer processing, and to create a long (wide) cryptographic key for security ensuring chip operation. A different key is thus provided on each chip without an associated lithographic masking level of fuse activation. Read and decode is functions may be provided by using on-chip CMOS logic circuits.

Figure 1A:
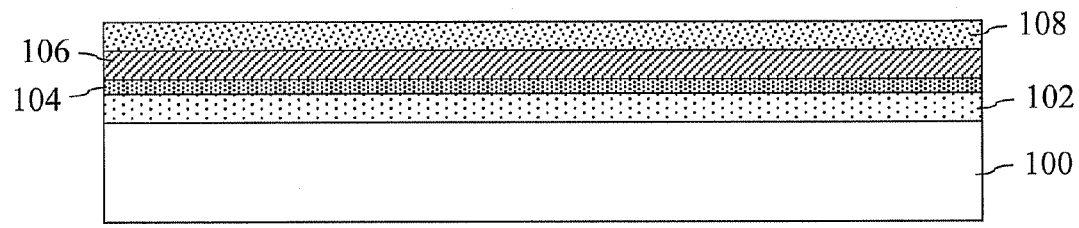
FIGS. 1(a) through 1(f) are cross sectional views of a method for forming stochastic integrated circuit device layer, in accordance with an embodiment of the invention.

Referring generally to FIGS. 1(a) through 1(f), there is shown a series of cross sectional views of a method for forming stochastic integrated circuit device layer, in accordance with an embodiment of the invention. As shown in FIG. 1(a), a substrate 100 has a lower conductive layer 102 formed thereon. The substrate 100 may be, for example, a silicon substrate, although other materials are also contemplated. Such other materials can include other types of semiconductor material, but could also include an insulating material such as glass.

The lower conductive layer 102 may be a deposited material, such as Ti, TiN, W, Ta, TaN, Ag, Ru, Rh, and Si, as well as alloys, combinations, and multilayer stacks thereof. In one exemplary embodiment, a suitable material for the conductive layer 102 is aluminum with an underlayer of Ti, deposited by physical vapor deposition (PVD). However, the conductive layer 102 may also be deposited by physical vapor deposition (PVD), atomic layer deposition (ALD), electrodeposition, electroless deposition, or a combination of the same. Alternatively, where the substrate 100 is a semiconductor material, the lower conductive layer 102 may be formed by doping the substrate 100 with a material such as P, As, B, $BF_2$, and Sb, for example. The lower conductive layer 102 may be formed in a continuous fashion across the substrate 100 or, optionally, it may be patterned such that it is formed only in desired regions over the substrate 100. In the event the conductive layer 102 is formed in desired regions over the substrate, such formation could be a subtractive process (e.g., blanket metal deposition followed by etch) or an additive process (e.g., damascene processing through conductive material fill of etched regions from an insulating layer).

As further illustrated in FIG. 1(a), an etch stop layer 104 is formed over the lower conductive layer 102, followed by an intermediate layer 106 formed atop the etch stop layer 104. In one exemplary embodiment, the stochastic device utilizes an array having a random distribution of capacitance values. In such a case, the intermediate layer 106 comprises a dielectric layer of relatively lower dielectric constant (K) with respect to the etch stop layer 104. For example, in the capacitive embodiment, the etch stop layer 104 may be a material such as a CVD nitride, aluminum oxide ($Al_2O_3$), $Ta_2O_5$, etc., while the dielectric layer 106 may be a material such as $SiO_2$, $Si_3N_4$, SiON, SiC, SiCN, SiCNH, SiCH, SiCOH, fluorosilicate glass, or other suitable dielectric material known in the art. The lower-K dielectric layer 106 may be deposited by CVD, PECVD, ALD, or spin-on processes, and may be thicker than the etch stop layer 104. In an exemplary capacitive embodiment, the dielectric layer 106 is $SiO_2$ deposited by PECVD techniques. Where the array utilizes a random distribution of resistance values, then the layer 106 may be formed from a material used in the formation of discrete resistor components used in semiconductor fabrication.

A mask layer 108 is then formed over layer 106. The mask layer 108 may include a single layer or multiple layers. However, in either instance, a desired property of the mask layer 108 is that it is a "self-assembling" material such as a diblock copolymer that has the properties of segregating into distinct phases to form patterns smaller than can be established utilizing convention photolithographic approaches. In an exemplary embodiment, the diblock copolymer masking layer is PMMA-PS (polymethylmethacrylate-polystyrene).

Diblock copolymers are composed of two chemically distinct polymer blocks. When films of diblock copolymers are annealed in an oven, nanometer-scale patterns called "microdomains" can be observed. The stripe patterns result from repulsion between the two halves of each polymer molecule. The width of these stripes is determined by the length of the polymer chains in the film. Initially, the patterns amount to no more than a random dappling of the film. Subsequently, the dark and light regions organize themselves into swirling "fingerprint" like patterns in the film. As time passes, the swirls become smoother and the defects become fewer. In this manner, the film progresses towards a regular parallel stripe pattern due to the system's desire to reach its most stable (i.e., lowest-energy) form.

Figure 1B:
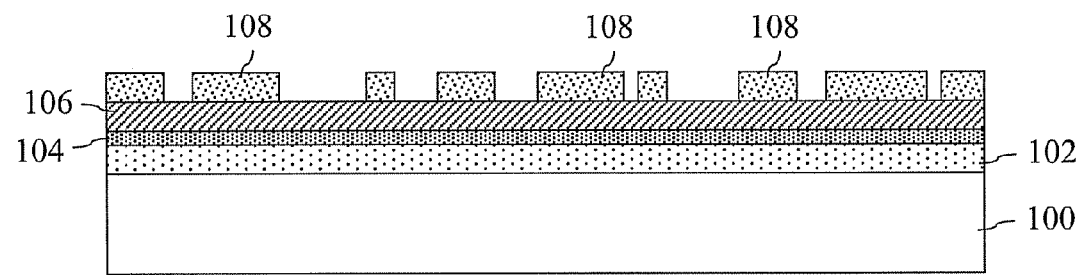

However, it should be noted that whereas certain other nanopore diblock copolymer applications specifically utilize the ordered nanopatterns that form over time, the present invention embodiments utilize the randomly formed microdomains of the film. Accordingly, the developed diblock layer 108 having randomly formed microdomains is shown in FIG. 1(b). The resulting mask may be used to directly pattern layer 106, and may additionally include other layers such as a patterning layer, a hardmask and/or a transfer layer. In one embodiment, the diblock PMMA-PS copolymer mask layer is included with a spin-on, silicon-containing antireflective coating (ARC) hardmask or a low-temperature (e.g., <250° C.) silicon oxide or silicon nitride PECVD film. A transfer layer may include an organic spin-on material such as NFC-1400 manufactured by Japan Synthetic Rubber company or SiLK® manufactured by Dow Chemical company. Other mask materials known to one skilled in the art may also be utilized.

Figure 1C:
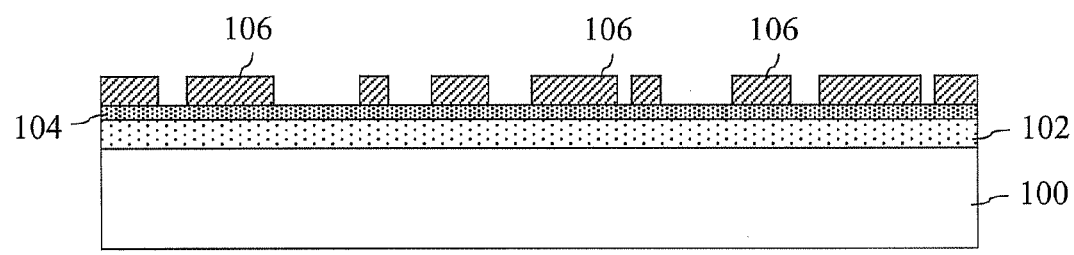

As shown in FIG. 1(c), the diblock copolymer mask pattern is then transferred into layer 106 through a process such as plasma etching (e.g., using Ar, $C_4F_8$, CO, and $O_2$, etc). Openings of randomly distributed size and shape are thus formed through layer 106 (e.g., capacitor dielectric material), stopping on etch stop layer 104. The mask material is then removed. Alternatively, it will be appreciated that in lieu of forming layer 106 and patterning the same using the diblock copolymer mask 108, the developed copolymer layer 108 itself could be used as a dielectric layer. In this case, layer 106 in FIG. 1(c) would actually represent the developed diblock copolymer, thereby simplifying the manufacturing process.

Figure 1D:
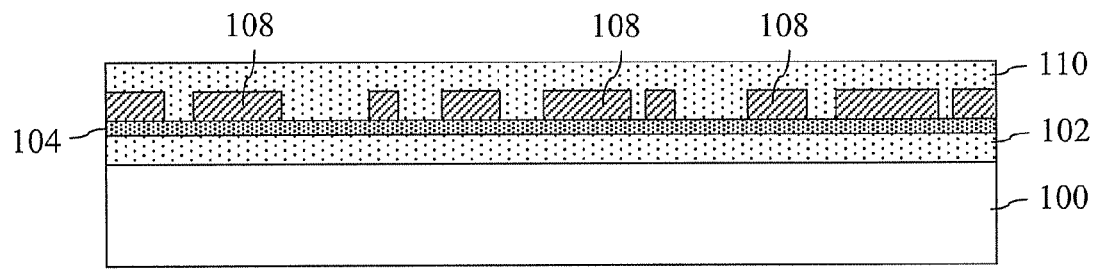

Regardless of the choice of material for layer 106, an upper conductive layer 110 is then formed over layer 106 and into the openings defined therein, as shown in FIG. 1(d). It will be noted that the etch stop layer 104 prevents shorting of the upper conductive layer 110 with the lower conductive layer 102. In the event that a developed diblock material is used as layer 106 itself (and not as a mask for etching of layer 106), then the etch stop layer 104 would more generally be referred to as a "short prevention" layer. As is the case with the lower conductive layer 102, the upper conductive layer 110 may be selected from materials such as Al, Ti, TiN, W, Ta, TaN, Ag, Ru, Rh, alloys and combinations thereof, as well as and multilayer stacks thereof. One exemplary material choice for the upper conductive layer is Al deposited by CVD.

Figure 1E:
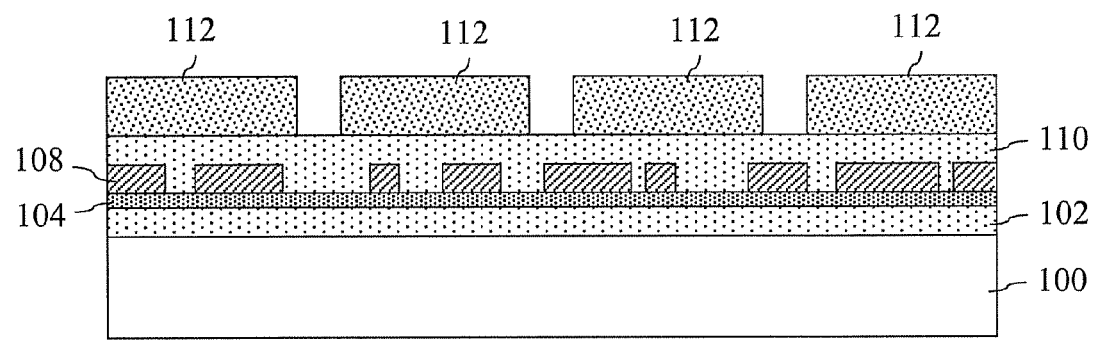
Figure 1F:
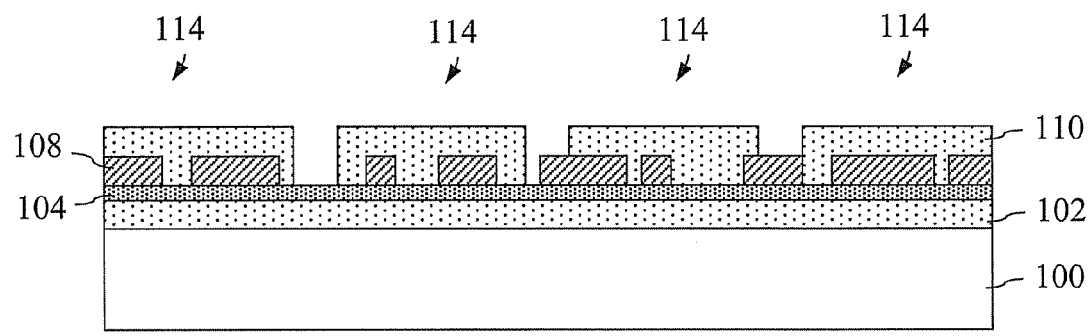
Figure 2:
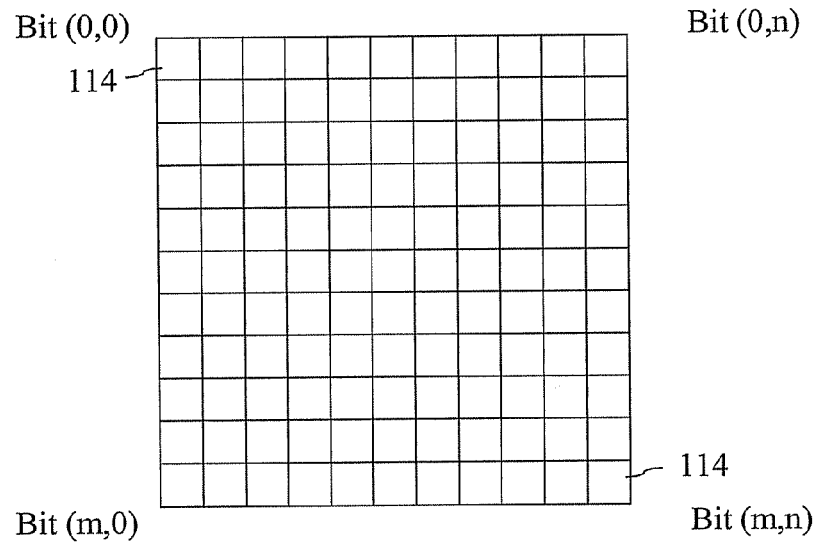
FIG. 2 is a plan view of an exemplary m×n array of individual unit cells having randomly distributed capacitance or resistance values utilizing the method shown in FIGS. 1(a) through 1(f)

Referring to FIG. 1(e), the structure is then further processed by masking with conventional photolithography. That is, a photoresist layer 112 is patterned in a manner that creates an array of cells of a defined shape (e.g., rectangular shapes). Then, in FIG. 1(f), the resist pattern is transferred into the upper conductive layer 110 so as to define an array of m×n cells 114 with randomly distributed values of capacitance (or resistance, depending on the selection of layer 106). In the case of a capacitive structure, each physically separated section of upper conductive layer 110 defines a top electrode, the randomly patterned portions of layer 106 beneath the top electrode (as well as the etch stop layer 104) defines a capacitor dielectric, and the lower conductive layer 102 defines a common bottom electrode for all cells 114. A plan view of the m×n array with individual unit cells 114 is illustrated in FIG. 2.

Figure 3:
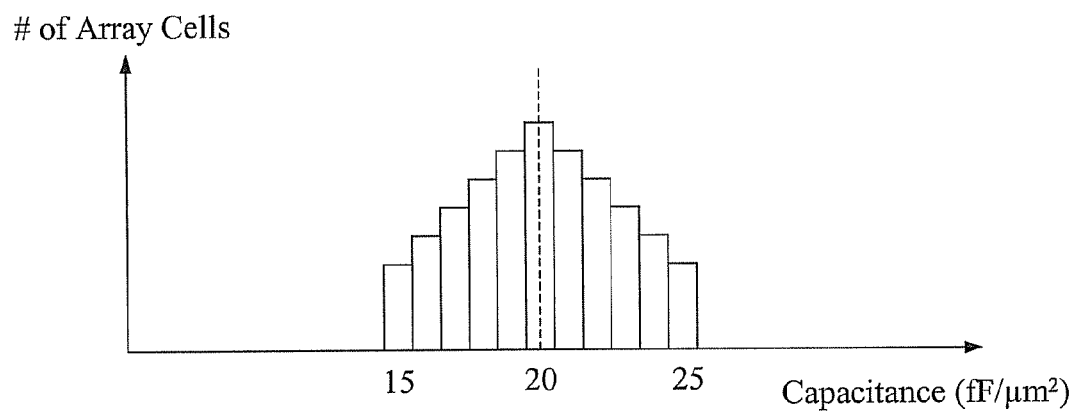
FIG. 3 is a histogram illustrating an exemplary capacitance distribution among individual array cells.

To take advantage of the randomized nanopore formation illustrated above in a practical fashion, an overall value of unit capacitance (or resistance) may be averaged to obtain a reference. With respect to the individual cells 114, the unit capacitance (or resistance) of any small portion of the array will be distributed in a range. For example, a 1000 µm×1000 µm area of thin film formed with the above described stochastic nanopore formation technique may have a capacitance value of about 20 fF/µm$^2$. However, any given 10 µm×10 µm sub-block (cell) of the overall 1000 µm×1000 µm thin film may have a capacitance value range from about 15 fF/µm$^2$ to about 25 fF/µm$^2$. Conceptually, a capacitance distribution for individually defined cells with a size of 10 µm×10 µm is illustrated by the histogram shown in FIG. 3. As is shown, the individual capacitance values for the population of array cell may be expected to conform to a Gaussian distribution about the normal value of 20 fF/µm$^2$.

Notwithstanding the use of a relatively high-K, uniform layer as an etch stop layer and a lower-K dielectric layer as a randomly patterned intermediate layer, the capacitance variations from cell to cell are still detectable. If the higher-K etch stop portion of the cell has a unit capacitance $C_h$, the intermediate dielectric layer can be formed in a manner such that its unit capacitance, $C_l$, is roughly ten times less than $C_h$. Thus, for a given array cell that has a patterning ratio of "r," wherein r represents the ratio of removed dielectric area to total cell area, and further assuming that r will vary anywhere from about 0.1 to about 0.4 (i.e., about 10% to about 40% dielectric removal), the capacitance variation of each cell may be estimated through the following expression: $(C_l*(1-r)+C_h*r)*A$, wherein A is the unit area of the cell. For example, if $C_l$=100 fF/A and $C_h$=1000 fF/A, then the resulting capacitance variation range after patterning will be from about 190 fF to about 460 fF, which is easily detectable using CMOS amplifier circuitry.

Figure 4A:
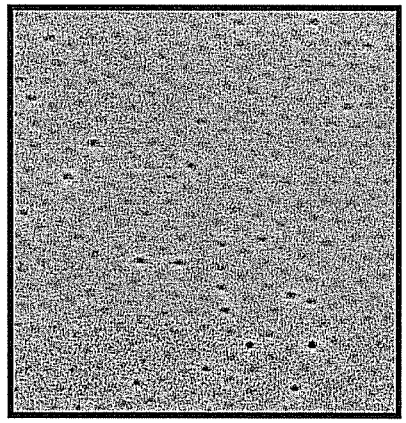
FIG. 4(a) is an image of a relatively ordered nanopore diblock copolymer film, with FIG. 4(b) illustrating the resulting pattern transferred into a sample layer.
Figure 4B:
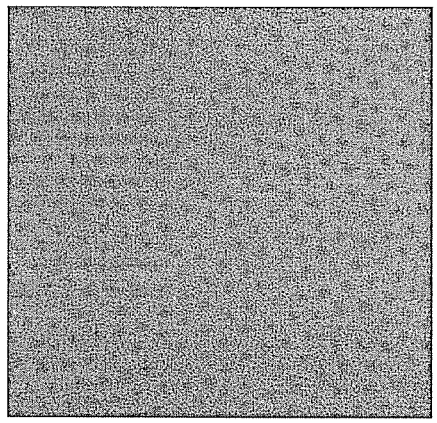
Figure 5A:
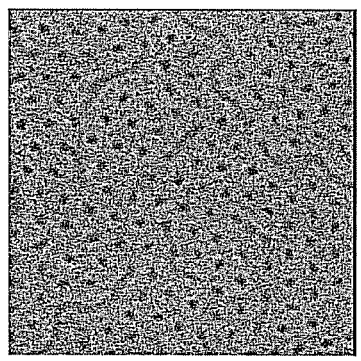
FIG. 5(a) is an image of a randomly distributed nanopore diblock copolymer film, with FIG. 5(b) illustrating the resulting pattern transferred into a sample layer, in accordance with an embodiment of the invention.
Figure 5B:
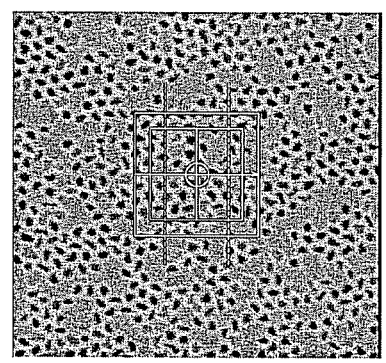

Finally, FIGS. 4(a), 4(b), 5(a) and 5(b) illustrate the random nature of a formed diblock copolymer layer. In FIG. 4(a), the diblock copolymer is allowed to progress to a more ordered nanopattern, which is then transferred into a sample layer as shown in FIG. 4(a). However, in FIG. 5(a), the self assembly the diblock copolymer is not intended to result in a regular, replicable pattern. Thus, when transferred into the sample layer in FIG. 5(b), the resulting patterned structure is of a random nature.

Accordingly, through the formation of such an array structure, a practical means for generating a unique random code is provided. For example, a sense amplifier circuit may be configured to compare the capacitance (or resistance) per unit area of a reference array to that from each data "cell," and thereby generate a binary "1" or "0" for that cell.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A stochastically based integrated circuit encryption structure, comprising:
    a substrate having an array of individual cells formed thereupon, each of the array cells including at least one layer therein formed in a manner so as to result in a nanopore structure of varying shape and size distribution among the cells;
    wherein a measurable electrical parameter of the individual cells has a random distribution from cell to cell with respect to a reference value of the electrical parameter,
    wherein the array further comprises:
    a lower conductive layer common to each of the array cells;
    a short prevention layer, common to each of the array cells, the short prevention layer formed over the lower conductive layer;
    an intermediate layer formed over the short prevention layer and patterned according to the nanopore structure of varying shape and size distribution, the intermediate layer comprising one of a dielectric layer and a resistive material layer; and
    an upper conductive layer formed over the intermediate layer.

2. The structure of claim 1, wherein:
    the intermediate layer comprises a dielectric layer;
    the lower conductive layer comprises a lower capacitor electrode common to each of the individual cells of the array;
    the patterned portions of the upper conductive layer comprise upper capacitor electrodes associated with the individual cells of the array;
    the randomly patterned portions of the intermediate layer comprise a capacitor dielectric associated with the individual cells of the array; and
    the short prevention layer comprises an etch stop layer.

3. The structure of claim 1, wherein the lower and upper conductive layers comprise one or more of: Ti, TiN, W, Ta, TaN, Ag, Ru, Rh, Si, alloys, combinations, and multilayer stacks thereof.

4. The structure of claim 1, wherein the lower conductive layer comprises a doped silicon substrate.

5. The structure of claim 2, wherein the intermediate layer comprises one of: $SiO_2$, $Si_3N_4$, SiON, SiC, SiCN, SiCNH, SiCH, SiCOH, and fluorosilicate glass.

6. The structure of claim 5, wherein the etch stop layer comprises one of: aluminum oxide ($Al_2O_3$), $Ta_2O_5$, and a CVD deposited nitride.

7. The structure of claim 1, wherein the intermediate layer comprises a diblock copolymer layer.

8. The structure of claim 7, wherein the diblock copolymer layer comprises PMMA-PS (polymethylmethacrylate-polystyrene).

9. The structure of claim 8, wherein the etch stop layer comprises one of: aluminum oxide ($Al_2O_3$), $Ta_2O_5$, and a CVD deposited nitride.

* * * * *